United States Patent
Karg et al.

(10) Patent No.: US 11,164,068 B1
(45) Date of Patent: Nov. 2, 2021

(54) FEATURE RECOGNITION WITH OSCILLATING NEURAL NETWORK

(71) Applicant: International Business Machines Corporation, Armonk, NY (US)

(72) Inventors: Siegfried Friedrich Karg, Adliswil (CH); Elisabetta Corti, Adliswil (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/097,109

(22) Filed: Nov. 13, 2020

(51) Int. Cl.
*G06N 3/04* (2006.01)
*H03K 5/02* (2006.01)

(52) U.S. Cl.
CPC .................. *G06N 3/04* (2013.01); *H03K 5/02* (2013.01)

(58) Field of Classification Search
CPC .................................... G06N 3/04; H03K 5/02
USPC ........................................................ 327/306
See application file for complete search history.

(56) References Cited

U.S. PATENT DOCUMENTS

| | | | | |
|---|---|---|---|---|
| 7,280,989 B1 * | 10/2007 | Hoppensteadt | ........ | G06N 3/049 706/30 |
| 8,812,226 B2 | 8/2014 | Zeng | | |
| 2019/0122095 A1 * | 4/2019 | Karg | ...................... | G06N 3/063 |

FOREIGN PATENT DOCUMENTS

| | | |
|---|---|---|
| KR | 970010032 B1 | 6/1997 |
| WO | 2006000103 A1 | 1/2006 |

OTHER PUBLICATIONS

Velichko et al., "A Model of an Oscillatory Neural Network with Multilevel Neurons for Pattern Recognition and Computing", MDPI, Electronics, Article, Publication Date: Jan. 9, 2019, doi:10.3390/electronics8010075, 26 pages.

Cotter et al., "Computational Architectures Based on Coupled Oscillators", 2014 IEEE Computer Society Annual Symposium on VLSI, DOI 10.1109/ISVLSL2014.87, 2014, 6 pages.

Tsai et al., "Enabling New Computation Paradigms with HyperFET—An Emerging Device," IEEE Transactions on Multi-Scale Computing Systems, vol. 2, No. 1, Jan. 1-Mar. 2016, 19 pages.

\* cited by examiner

*Primary Examiner* — Tomi Skibinski
(74) *Attorney, Agent, or Firm* — Jeffrey M. Ingalls

(57) ABSTRACT

An electronic circuit for enabling an efficient use of an oscillating neural network for feature recognition may be provided. The electronic circuit comprises a network of coupled voltage-controlled oscillators, wherein each of the voltage-controlled oscillators is adapted for receiving an edge input signal which is phase-shifted by a fraction of a period length of the voltage-controlled oscillators according to a signal strength of an analog input signal allotted to a respective one of the voltage-controlled oscillators, and an active output circuit. The active output circuit includes input terminals connected to selected ones of the voltage-controlled oscillators, an adder portion for adding input signals present at the input terminals, and a non-linear amplifier, an which input line is of the non-linear amplifier being connected to an output line of the adder portion, thereby an efficient use of an oscillating neural network.

20 Claims, 8 Drawing Sheets

302

304

FEATURE RECOGNITION WITH OSCILLATING NEURAL NETWORK

BACKGROUND

The present disclosure relates generally to a neural network, and more specifically, to an electronic circuit for enabling an efficient use of an oscillating neural network for feature recognition. The present disclosure also relates to a neural network device.

Continuous data growth is one of the ongoing trends for enterprise IT (information technology). In order to generate meaningful results, enterprise IT organizations thrive for a more and more intensive usage of anyway available and newly collected data by continuously better analysis. However, classic data analysis techniques may no longer be sufficient to analyze the vast amount of unstructured (or semi-structured data). With the proliferation of ultra-high-speed networks, more networks, and Internet-connected devices, the world is generating exponentially increasing amounts of data that needs to be processed in a fast, efficient and "smart" way.

SUMMARY

According to some embodiments, an electronic circuit for enabling an efficient use of an oscillating neural network for feature recognition may be provided. The electronic circuit comprises a network of coupled voltage-controlled oscillators, wherein each of the voltage-controlled oscillators is adapted for receiving an edge input signal which is phase-shifted by a fraction of a period length of the voltage-controlled oscillators according to a signal strength of an analog input signal allotted to a respective one of the voltage-controlled oscillators, and an active output circuit. The active output circuit includes input terminals connected to selected ones of the voltage-controlled oscillators, an adder portion for adding input signals present at the input terminals, and a non-linear amplifier, an which input line is of the non-linear amplifier being connected to an output line of the adder portion, thereby an efficient use of an oscillating neural network.

According to certain embodiments, a neural network device comprising a plurality of the electronic circuits, as described above, may be provided.

The proposed electronic circuit for enabling an efficient use of an oscillating neural network for feature recognition may offer multiple advantages, technical effects, contributions and/or improvements:

One of the beneficial features of the proposed concept, which traditionally are typically implemented using digital neural networks, is that multiple feature extraction functionalities may be implemented within the same filter unit of the analog oscillating neural network. The proposed layers of neural networks may be cascaded in a straightforward manner in order to apply multiple filters in a staged architecture. However, also in such a design each layer may be recognizing a plurality of features in one step.

Using a more or less straight forward oscillatory neural network, the active output circuit may make an efficient use of the results of the oscillatory neural network. The active output circuit(s) is/are adapted with a very limited amount of analog electronic components to determine a predefined pattern in a given input matrix. Moreover, the active output circuit is component-wise comparable lightweight.

Thus, the here proposed concept is supporting an industry strategy using analog AI (artificial intelligence) cores, thereby allowing extremely fast pattern recognition of any kind. Additionally, the analog circuits may enable very low power consumption in comparison to traditional alternative digitally operated hardware accelerators. Encoding the information of, e.g., a color channel of a digital image in the phase of the signals, may allow a very low voltage operation.

Furthermore, the proposed embodiments may also allow the use of resistive memory which may be used as synaptic weights. Furthermore, the oscillating neural network may easily be trained off-line using a Hebbian learning algorithm.

In addition, because of its function, the active output circuit may also act as a majority gate which outputs a signal in phase, the majority of its input signals having different phases.

According to an embodiment, the electronic circuit may also comprise a plurality of active output circuits, wherein the input terminal of each of the plurality of active output circuits may be connected to groups of oscillators, wherein each group may represent a different predefined pattern of the received input signals. Hence, each combination of oscillators (i.e., each group of oscillators) may represent a specific pattern if the same elements of matrix input signals are always fed to the same oscillators.

According to another embodiment of the electronic circuit, the selected oscillators, when phase-shifted activated, represent a predefined pattern of the received input signals. In a 3×3 input matrix a multitude of different patterns may be recognizable this way (e.g., a falling diagonal line, a middle horizontal line, a rising die of an outline, a vertical middle line and/or L-shaped pattern, or single dot patterns). Using an oscillatory neural network, each different pattern may be determined using a pattern-specific active output circuit. It should be appreciated that the mentioned patterns are only examples, and that other pattern may be determinable (e.g., corner or edge patterns).

According to an embodiment, the electronic circuit may be adapted to process signals of one color channel. Thus, by implementing as many of the electronic circuits and operating them in parallel as there are color channels, the information of all color channels may be proces sable together. This may also be independent of the used color model and the number of parallel color channels.

According to an embodiment, the electronic circuits may represent a plurality of the electronic circuits connected in series, wherein each to the electronic circuits represents a predefined filter. Thus, the output of one of the electronic circuits may be used as input for the next layer represented by the next electronic circuit. Therefore, cascading filters may be implemented in a deeper neural network. Consequently, deep neural networks may no longer be a domain limited to traditional artificial neural networks.

According to a preferred embodiment of the electronic circuit, each of the input terminals of the adder portion of the active output circuit may be connected to an input of a linear amplifier via a separate resistor, respectively. Therefore, they may have, e.g., all the same resistance value so that the input signals (also reflecting the phase of the input signals to each other) may be added in a straightforward manner.

According to an embodiment of the electronic circuit, the non-linear amplifier may be a differential operation amplifier (i.e., voltage feedback OpAmp). It may have a semiconductor diode and forward direction in its feedback loop. This second component of the active output circuit may be interpreted as representing the sigmoid or ReLU functional of traditional neural network cores.

According to an embodiment of the electronic circuit, each of the oscillators in the network may be connected to each other oscillator via resistor/capacitor coupling circuits. Hence, a fully connected network may be realized. However, alternatively, the network does not need to be fully connected. The proposed concept may also work with more limited connection between the different oscillators.

According to another embodiment of the electronic circuit, the fraction of the period—in particular, the time shifted signals for "0" and "1" input signal—may be half a period of the oscillating frequency of the oscillators. Thereby, it may be assumed that all oscillators oscillate on basically the same frequency. It has been proven to be used for that the fraction of the period is at least larger than 120° if compared to the period of each of the oscillators. Advantageously, the fraction may be 180°. Using this phase-shift (or time-shift) between the "0" and "1" signals may show the best effect so that the detectability of the specific patterns can be performed with a very high reliability.

According to an embodiment of the electronic circuit, the active output circuit may be integrated into a semiconductor unit. Furthermore, a plurality of active output circuits may be integrated into one semiconductor device. E.g., all active output circuits required for all potential patterns of a given input matrix may be integrated into one semiconductor device. Furthermore, also the oscillating neural network may be integrated within the same semiconductor device. In an even enhanced embodiment, the complete electronics required for all color channels (i.e., the plurality of ONNs as well as the related active output circuits) may be integrated into a single integrated unit (i.e. a single specialized semiconductor die), and thus, as a high performance analog neural network chip.

According to an embodiment of the electronic circuit, the phase-shifting of an output of the nonlinear amplifier of the active output circuit may be aligned with the majority of the received bit input signals. That is, if more "0"s are received, the phase at the output of the electronic circuit may be in line with the phase of the received "0" s. If more "1"s are received, the phase at the output of the electronic circuit may be in line with the phase of the received "1"s. Hence, an easy synchronization between the different stages of subsequent layers may be achieved. For example, in the 3×3 matrix example, if 5 sub-squares are black (corresponding, e.g., to a logical "1") the phase of the output signal of the proposed electronic circuit may be aligned with the phase of the "1"s and vice versa.

According to an embodiment, the edge input signal may change from logical "0" to logical "1" depending on a shifting time derived from the signal strength of the analog input signal. Hence, if a quasi-analog grey scale value is measured, the quasi-analog value is not used directly as input value for a respective oscillator but it may first be passed to a time shifting unit (or phase shifting unit) adapted for generating a time shift for a digital output signal of this unit wherein the time shift value corresponds to the quasi-analog grey scale. Consequently, and according to certain embodiments, the edge input signal may change from logical "0" to logical "1" depending on the shifting time derived from the signal strength of the analog input signal.

According to an embodiment, each of the oscillators may oscillate with the same frequency. This may render the dependencies between the plurality of oscillators and network components implementing the feedback loops a controllable mathematical problem for simulation (and also in practice) instead of an unmanageable complex set of dependencies which may be difficult to train as an oscillating neural network.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, explain the principles of the disclosure. The drawings are only illustrative of certain embodiments and do not limit the disclosure.

It should be noted that embodiments are described with reference to different subject-matters. In particular, some embodiments are described with reference to method type claims, whereas other embodiments are described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be disclosed within this document.

The aspects defined above, and further aspects of the present embodiments, are apparent from the examples described hereinafter and are explained with reference to the examples of embodiments, but these examples are not to be construed as limiting.

Figure 1:
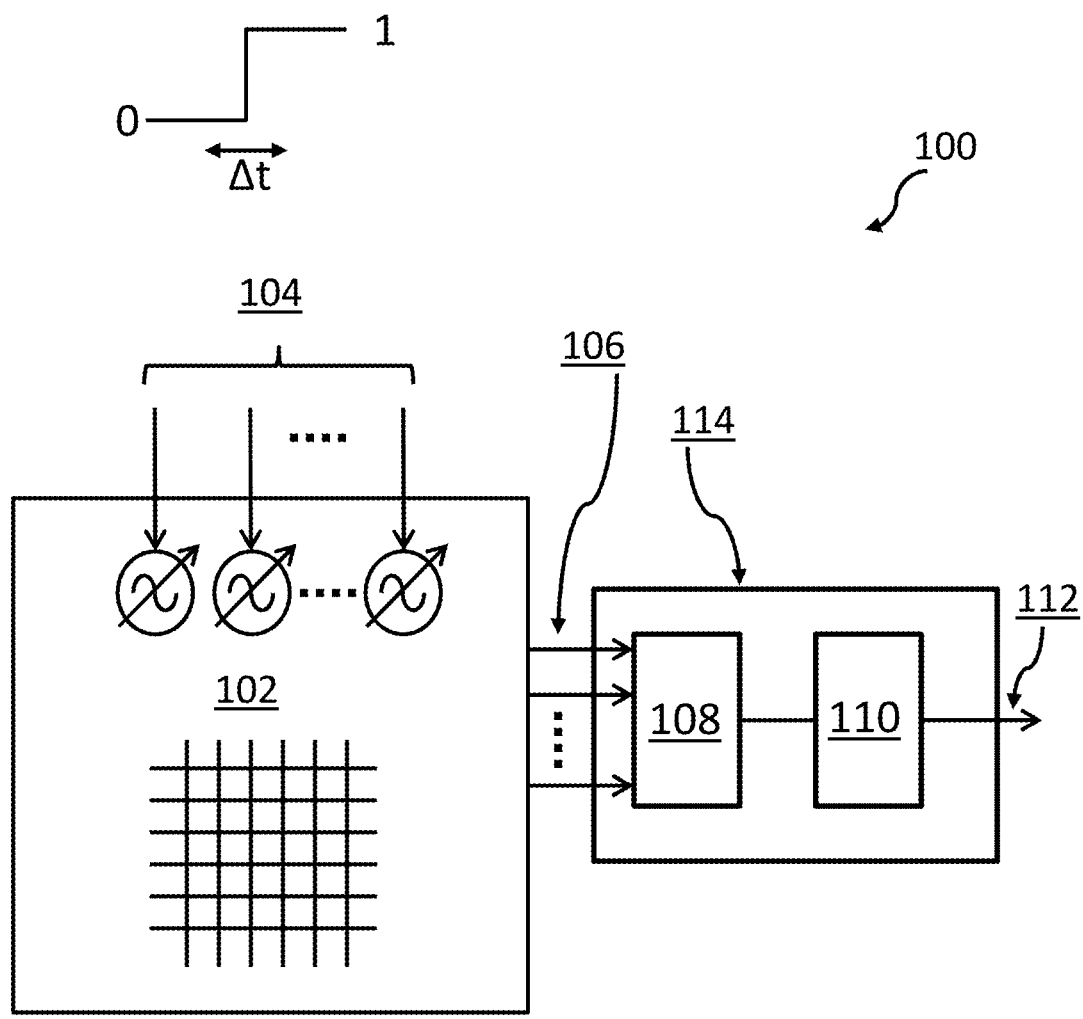

FIG. 1 shows a block diagram of an embodiment of an electronic circuit for enabling an efficient use of an oscillating neural network for feature recognition.

Figure 2:
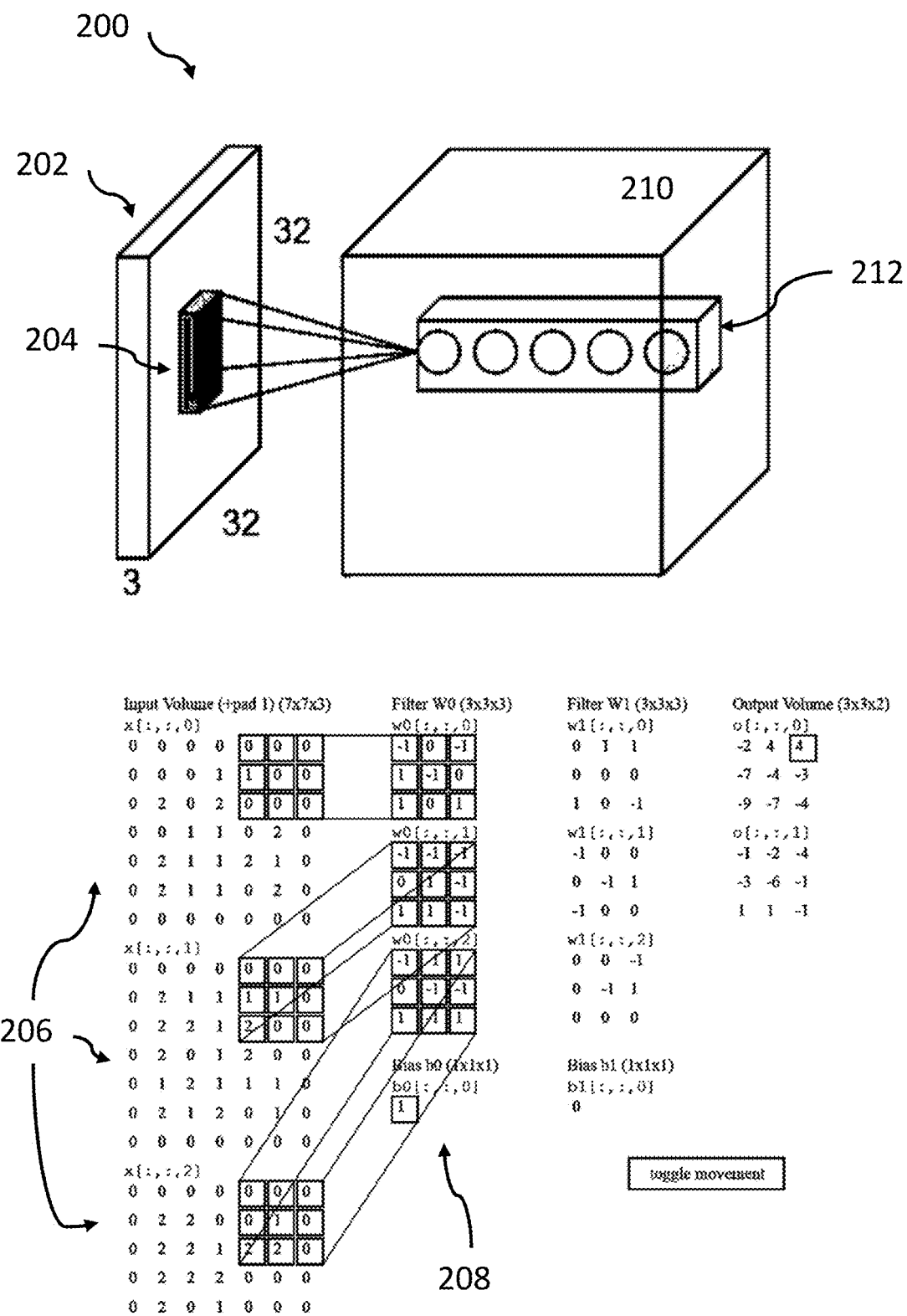

FIG. 2 refers to the technical context in which the proposed system of the electronic circuit according to FIG. 1 can be used.

Figure 3A:
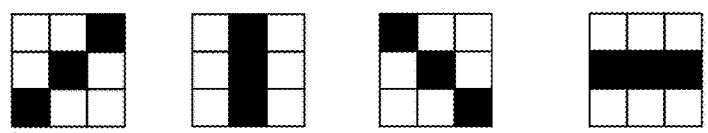

FIG. 3a shows examples of digital patterns.

Figure 3B:
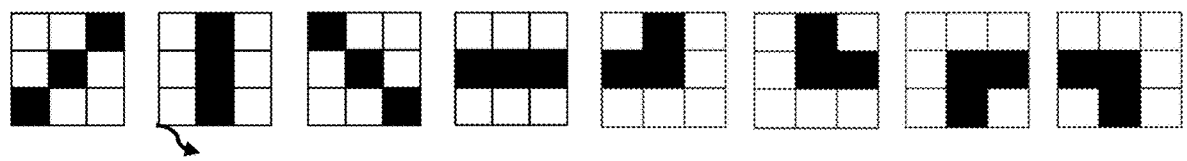

FIG. 3b shows examples of more complex digital patterns.

Figure 4:
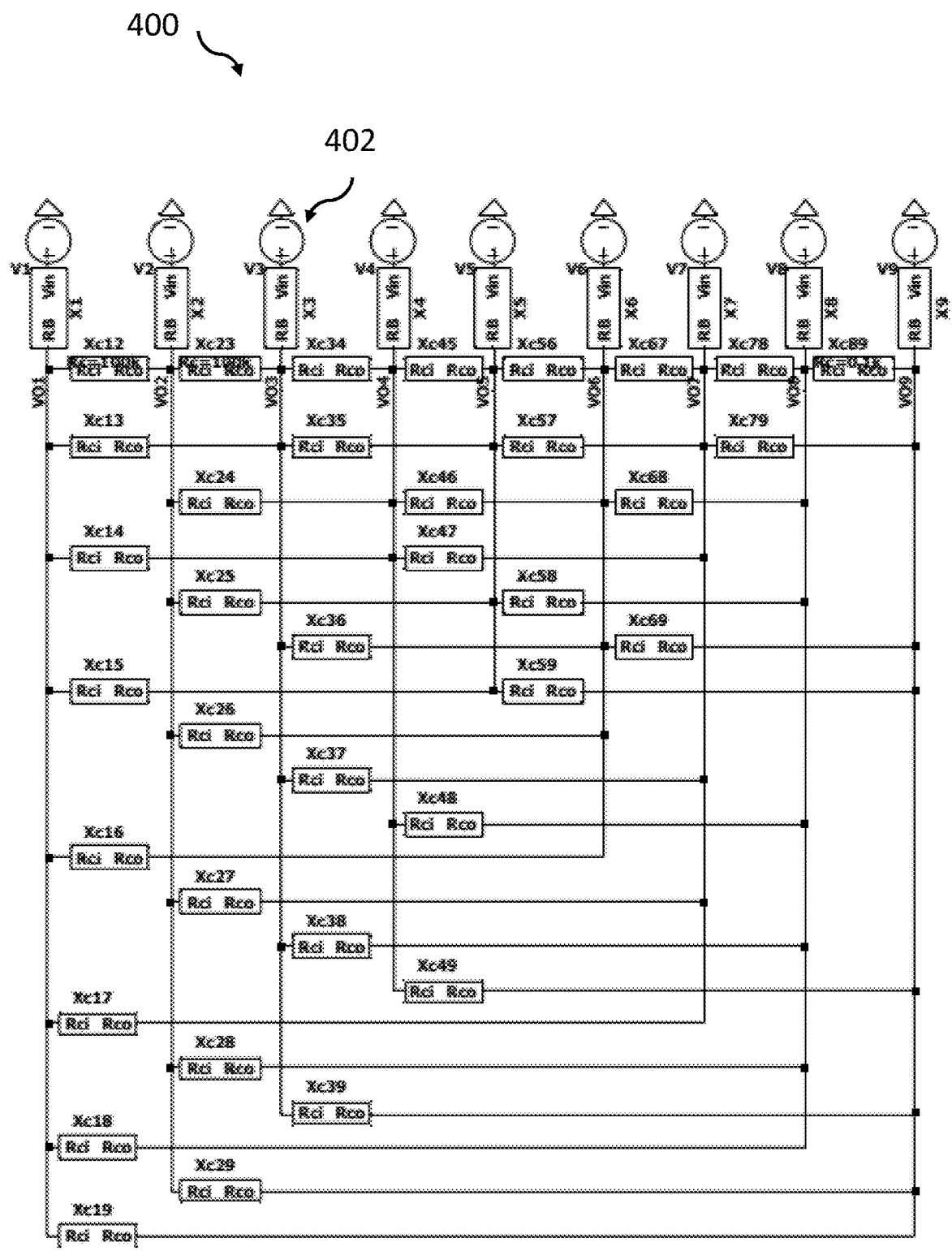

FIG. 4 shows an electrical wiring diagram of an embodiment with the 3×3 network of coupled voltage-controlled oscillators.

Figure 5:
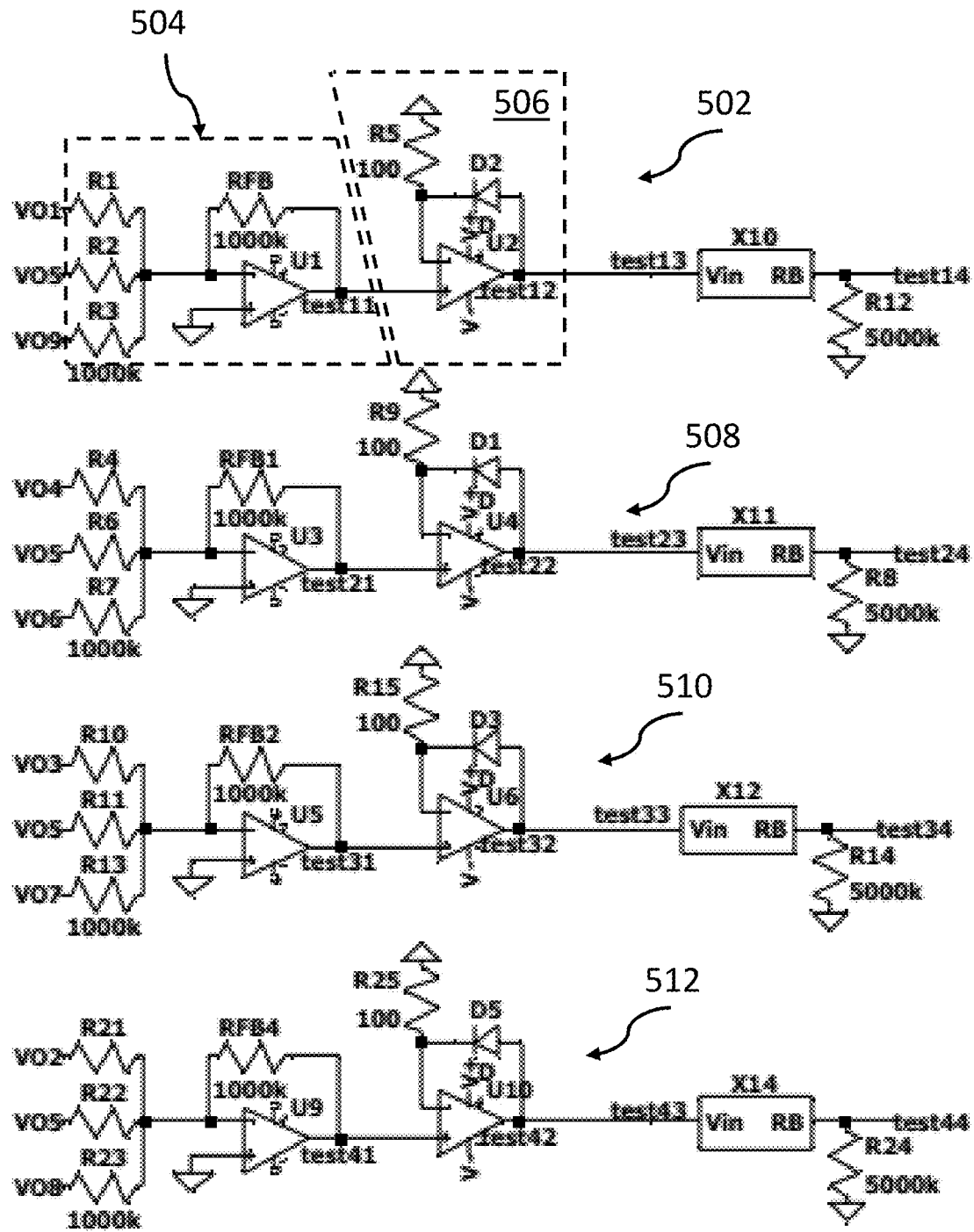

FIG. 5 shows an embodiment of the active output circuit.

Figure 6:
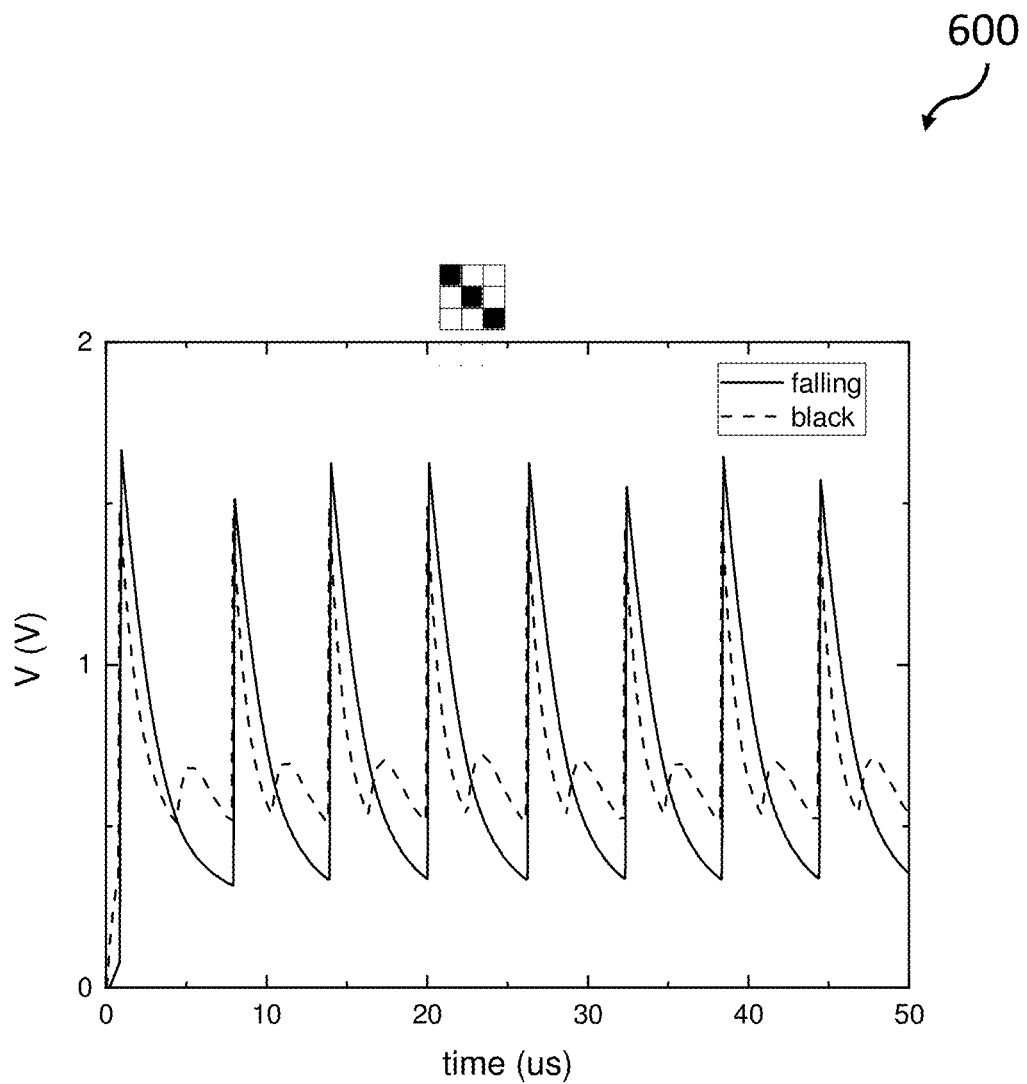

FIG. 6 shows time dependent output signals of the electronic circuit together with a reference signal for one sample that is a falling diagonal line.

Figure 7:
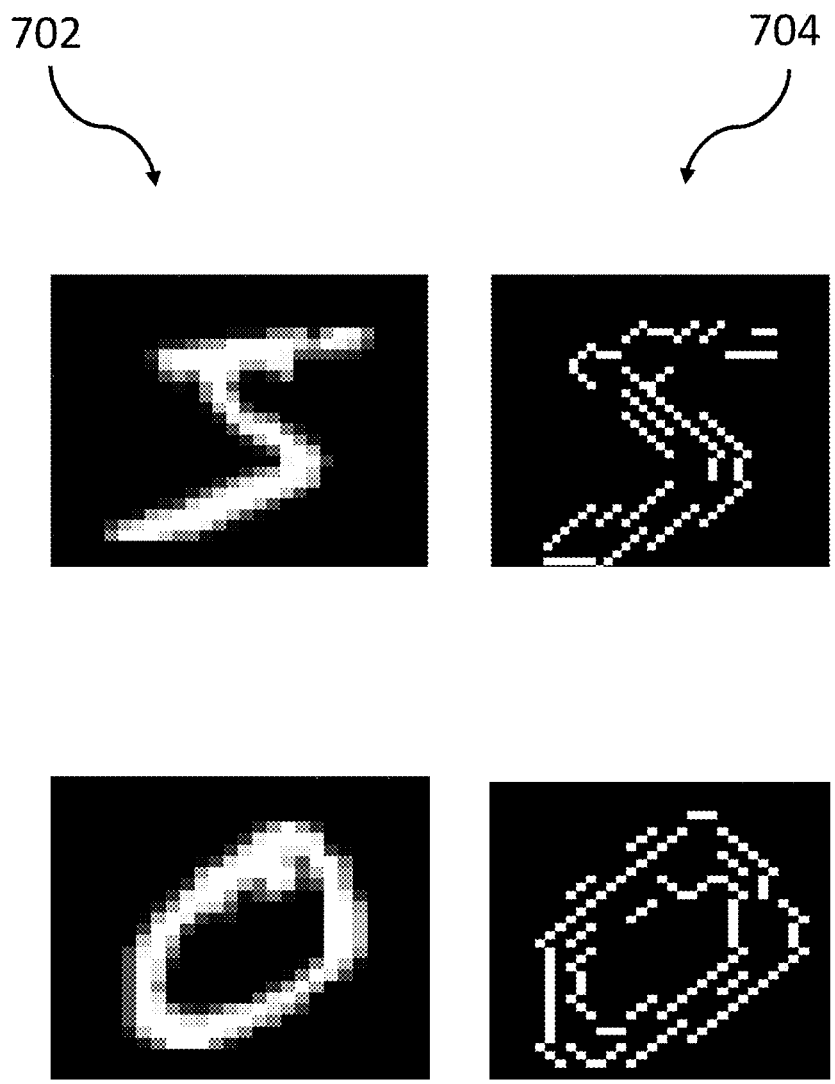

FIG. 7 shows results of input images from the MNIST database and resulting edge detections images.

Figure 8:
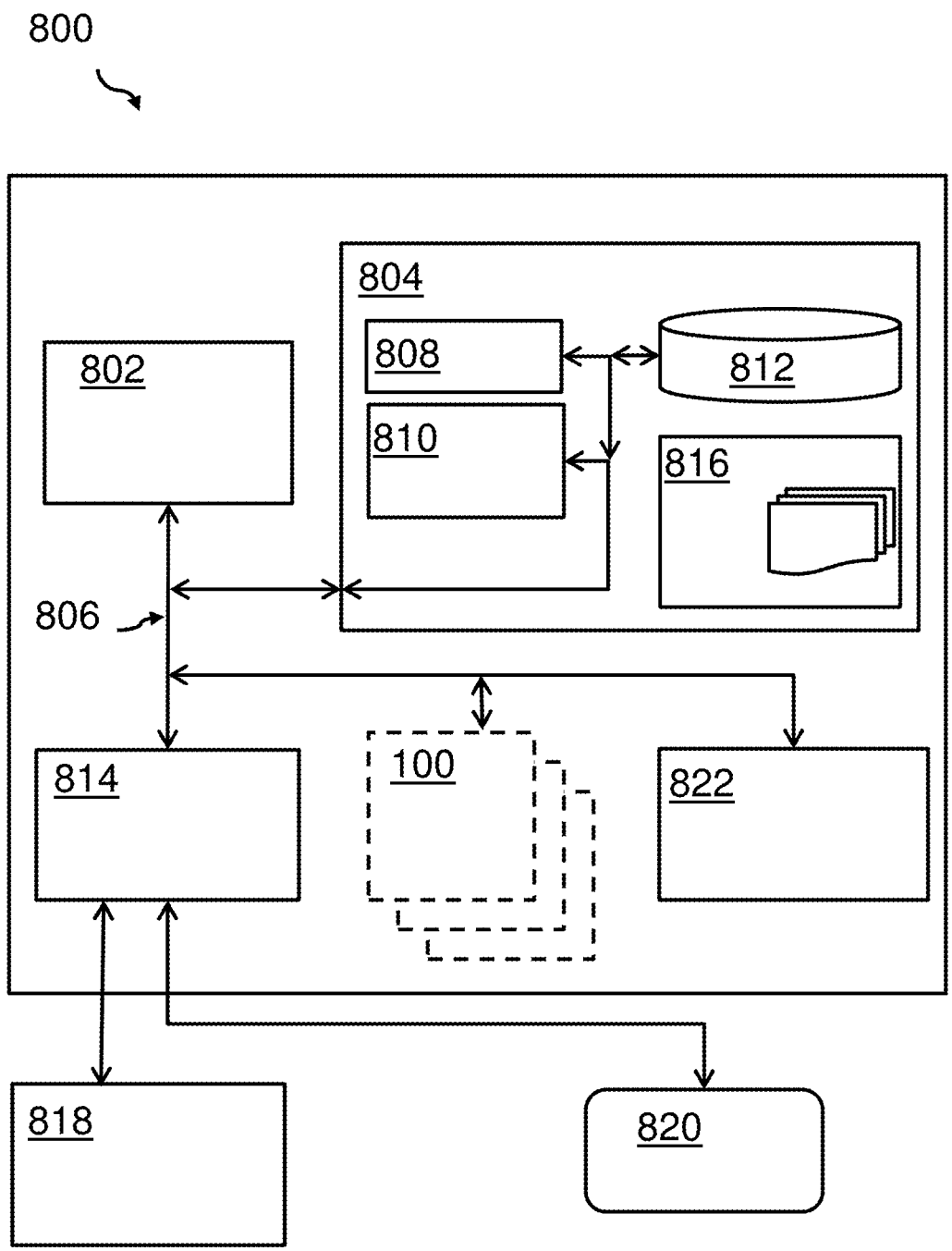

FIG. 8 shows a computing system utilizing the electronic circuit according to FIG. 1 or the related device for more than 1 color channel as coprocessor for processing image data.

DETAILED DESCRIPTION

Science and enterprise IT organizations are increasingly using artificial intelligence (AI) techniques to better understand the large amounts of data and generate value out of it. However, traditional van-Neumann computing architectures may no longer be sufficient to deal with the ever-growing amount of data, data movements and the related computing requirements.

Especially, AI methods and techniques may require a lot of mathematical operations to the input data, e.g., in the form of matrix-matrix multiplications, often used in, e.g., image recognition/classification, autonomous navigation, and audio analysis in the frequency domain. Such data belong more and more—alongside with speech data, other sound data, as well as input in form of text documents or a mixture of text and image—to the stream of incoming data in traditional data centers, as well as in cloud data centers. The consequence is a continued requirement to process the continuously exponentially growing amount of data and ever increasing processing speed consuming more and more electrical power.

However, also using AI systems in the form of traditional neural networks is not always sufficient because classical neural systems based on digital data processing with a simulation of weight values in digital form may better be treated as analog values, and they may still require too much computing power. This may be mainly because of the large amount of matrix/vector multiplications which may require too much electrical power. This may become an issue in IoT (Internet of Things) environments in which a preprocessing of input data (e.g., as images from cameras) may be performed instead of first transferring the data to a central place and then centrally processing the measured data.

Hence, there it may be desirable to implement low-power, high-speed data processing devices which may be operated as, e.g., co-processors to traditional computing systems, which may require much less power than the traditional computing architectures.

Certain approaches have tried to use electronic analog technology in order to address the power aspect successfully. For this, oscillatory neural networks (ONN) have been used as artificial neural networks which employ a network of coupled oscillators. Thereby, the oscillators can correspond to neurons—using the biological brain model as reference—of the neural network, and the synaptic weight between pairs of new neurons—i.e., pairs of oscillators—may be emulated by the form and the strength of the coupling between the oscillators. Such networks can be trained to perform correlation tasks, such as image classification and/or speech recognition, by processing training samples in the network and adapting the matrix of network weights so that the network "learns" or retrieves the particular correlations to be detected. Few hardware implementations have been proposed for ONNs. These networks typically rely on mathematical pre-training of the weights matrix, e.g., via a Hebbian learning algorithm.

Certain proposed techniques continue to lack an efficient use of an oscillating neural network and a coupling between different layers of the neural network. Thus, there is a need for a better output signal processing of the core oscillating neural network.

In the context of this description, the following conventions, terms and/or expressions may be used:

The term 'electronic circuit' may denote a circuit comprising electronic and electric components and/or devices selectively electrically connected, so that electrical potential can propagate along the used wires and/or that electrical current may flow through the wires from at least one of the electronic and electric components to another one. The electronic components may comprise active semiconductor devices such as transistors or diodes, whereas the electric components may comprise wires and passive components such as resistors and capacitors.

The term 'oscillating neural network' (ONN) may denote selectively interconnected—directly or indirectly—oscillators. It may be an all-to-all connected network or a selectively connected network. Hence, the oscillators may be seen as coupled. Such oscillating neural networks may be considered as artificial neural networks. The oscillators may correspond to neurons—if referred to the biological brain model—of the artificial neural network, and the synaptic weight between pairs of new neurons—i.e., pairs of oscillators—may be emulated by the form and the strength of the coupling components between the oscillators. Such networks may be trained to perform correlation tasks, such as pattern recognition, image classification and/or speech recognition, by processing training samples in the network and adapting the matrix of network weights—i.e., the coupling elements—so that the network is trained to determine in the inference phase—the particular correlations. As training method for adjusting the coupling factors between the oscillators, a Hebbian learning algorithm may be used.

The term 'feature recognition' may denote a sort of pattern recognition. This may relate to tasks known from, e.g., image recognition. However, the principles may also be used successfully for speech recognition and other kinds of digitally available signal patterns. Features to be recognized and images may comprise horizontal lines, vertical lines, rising lines, falling lines, corners and the like. Typically, fractions of a larger image comprising only a small plurality of pixels are used as input for future recognition systems.

The term 'coupled voltage-controlled oscillators' may denote an electronic oscillator which phase may be controlled and shifted by an input voltage. Additionally, the plurality of oscillators may be coupled so that the respective outputs of the oscillators influence each other. It may be a fully connected network connecting each oscillator to each of the oscillators in the network, or it may be a selectively connected network. An example for coupling components between the oscillators may be RC (resistor/capacitor) filters. However, also other types of coupling components—e.g., active coupling elements comprising also semiconductor components—may be used.

The term 'edge input signal' may denote an incoming signal edge received by an oscillator. Selected edges of the input signal may be time-shifted, i.e., they may not arrive at the same time even if the individual bits originate from the same source—e.g., a sliding window over a digital image—in the sense that, e.g., a signal corresponding to a weak grey value may arrive earlier than a dark grey value related edge at a selected oscillators. This effect may also be noted as phase-shifted in respect to the period length of the swinging oscillators.

The term 'active output circuit' may denote an electronic circuit—in particular a portion of the complete electronic circuitry proposed here—adapted to interpret combined output signals of the plurality of oscillators. The active output circuits are basically adapted to determine correlation signals comparable with reference signals in order to identify or recognize predefined pattern like, a horizontal line, a vertical line, a rising line or a falling line.

The term 'adder portion' may denote a partial component of the active output circuit comprising a linear amplifier to which resistors are connected. The linear amplifier is thereby adapted to add time-dependent voltage signals received at the input side of the resistors.

The term 'non-linear amplifier' may denote an amplifier whose output curve does not dependent linearly on the input signal, but which—after a threshold value is exceeded—may generate and over proportionally larger open signal if compared to the input signal. Such behavior may be compared to the sigmoid function or the behavior of a ReLU unit of a traditional neural network.

The term 'color channel' may denote a layer of pixel information of a color digital image. In the context of this document none of the known color models is preferred. An RGB (red/green/blue) color model as well as a CYMK (cyan/magenta/yellow/black portion) may be used. Each pixel in one color channel may be represented by one bit or a plurality of bits for a respective grayscale in that selected color channel.

In the following, a detailed description of the figures will be given. All instructions in the figures are schematic. Firstly, a block diagram of an embodiment of the inventive electronic circuit for enabling an efficient use of an oscillating neural network for feature recognition, the electronic circuit comprising electronic circuit for enabling an efficient use of an oscillating neural network for feature recognition is given.

FIG. 1 shows a block diagram of an embodiment of an electronic circuit 100 for enabling an efficient use of an oscillating neural network for feature recognition. The electronic circuit comprises a network 102 of coupled voltage-controlled oscillators. Each of the oscillators is adapted for receiving an edge input signal 104—e.g., of a matrix or a vector—which is phase-shifted by a fraction of a period length—e.g., 180°—of the voltage-controlled oscillators according to a signal strength of an analog input signal allotted to the respective oscillator. For example, the time-shift may be in the range of 750 ns.

This edge input signal 104 is also symbolized by the 0/1 edge signal shown above the edge input signal 104. The horizontal double arrow symbolizes the shift in time at which point in time the edge appears depending from e.g., a measured or received grey scale value, e.g., analog value of pixel of a convolutional window sliding over a larger digital image.

The electronic circuit 100 comprises at least one active output circuit 114 comprising input terminals 106 connected to selected ones of the oscillators, and an adder portion 108 for adding input signals present at the input terminals 106, and a non-linear amplifier 110 whose input line is connected to an output line of the adder portion, thereby an efficient use of an oscillating neural network. Time dependent signals at the output terminal 112 may be compared to known reference patterns in order to determine a predefined recognized feature.

FIG. 2 shows a technical context or conceptual diagram of a oscillatory neural network (ONN) 200 in which the proposed system of the electronic circuit according to FIG. 1 may be used. Convolutional neural networks may use multiple filters to detect features and images (e.g., edge detection, color blotch detection, and so on). Typically, for each feature, a different filter is used, often using digital logic circuits. Moreover, filters may be applied sequentially or may require multiple computing cores. In contrast, the electronic circuit of the present embodiments is capable of performing multi-feature detection simultaneously in one single unit. The concept is based on time-encoded analog input signals such that the output classification signal can be derived from a phase signal.

Typically, convolutional (neural) networks use small filters sliding across an input layer. The input layer may exemplary be a digital image. Typical filter sizes are 3×3×3, 4×4×3, . . . , 7×7×3. Thereby, the last number indicates the number of color channels, e.g., RGB. However, also other color models may be used. If, e.g., a CMYK color model is used, the last number may preferably be 4.

The matrix 202 comprising 32×32×3 pixel information (when the last number indicates the number of color channels) may represent a digital image (or alternatively, a subset of a digital image). A subset 204 of the 3-dimensional matrix 202 may be represented by the matrices shown in the left lower part of FIG. 2, where each of the 7×7 matrices 206 may indicate one of the (e.g., 3) color channels. In a convolutional operation, a 3×3 window 208 is shifted over each of the 7×7 matrices 206 resulting in the second column of the lower part of FIG. 2 showing two resulting matrices, after the filters W0 and W1 have been applied. It may be noted that the details of the matrices are not critical. The general principle of convolutional networks is known and used as explanatory background for the further explanations.

Additionally, the box 210 may indicate a neural network comprising, e.g., five filters 212 being applied in a sequence.

Using the exemplary 3×3 matrix—as indicated above—different patterns may be recognizable depending on the digital greyscale values in the matrix cells. Examples 302 of recognizable patterns are shown in FIG. 3a. An extended set of patterns 304 of a 3×3 matrix is shown in FIG. 3b. However, for the subsequent part of the description, the patterns according to FIG. 3a may be kept in mind. It may be mentioned that although the original 3×3 matrix pixel comprises greyscale values, the recognized patterns are black and white (for edge detection), i.e., "1" and "0".

For comprehensibility reasons, each white sub-square may indicate a logical "0" and each black sub-square may represent a logical "1". Thus, e.g., four different basic patterns may be indicatable: a falling diagonal ("fall"), a horizontal line ("hor"), a rising diagonal ("rise"), and a vertical line ("vert"). The proposed electronic circuit is enabled to differentiate these four basic patterns. In order to classify the other exemplary pattern according to FIG. 3b during the inference phase of the oscillatory neural network, the input terminals of the active output circuit needs to be wired to outputs of the respective other ones of the oscillators. Thereby, the nine sub-squares of the exemplary filter window relate to the nine oscillators. The numbering scheme for the sub-squares can be (abbreviated form): top left=1, top middle=2, top right=3, . . . , lower right=9. This numbering scheme of the sub-squares can be used as indices for the oscillators.

FIG. 4 shows an electrical wiring diagram 400 of an embodiment of the 3×3 network of coupled voltage-controlled oscillators, i.e., the core of an oscillating neural network. The upper portion of FIG. 4 shows the delay-encoded edge input signals 402 (edges)—only one of them being referenced with a reference numeral—between input lines of the oscillators X1, . . . , X9 and ground. The input edge signals are symbolized by a circle comprising a "−" sign and a "+" sign. The "−" end of the bit-oriented input voltages are connected to ground (symbolized by the triangle). Input edge voltages V1, . . . , V9 are fed to the oscillators X1, . . . , X9. The output signals of the oscillators X1, . . . , X9 are denoted as V01, . . . , V09. These symbolize connection points to electric circuits which are shown in the following figures. Their phase-shift is either 0° or 180° (i.e., the maximum shift value). Hence, the shift may be interpreted as "0" and "1" and this black or white squared within the 3×3 matrix after having gone through the ONN.

The portion of FIG. 4 below the oscillators X1, . . . , X9 illustrate the network between the oscillators. In this example of nine oscillators, cross connections $Xc_{ij}$ are shown wherein i and j indicate the related oscillators. Hence, as an example, Xc12 indicates a coupling element between oscillator X1 and oscillator X2. As another example, a coupling element or coupling circuit in the middle of the cross connection network is denoted as Xc48 indicating a coupling circuit between oscillator X4 and oscillator X8. In this way, each of the oscillators is connected to each other oscillator via a respective coupling circuit $Xc_{ij}$. Therefore, the shown network is a fully connected network. However, in other implementations not all $Xc_{ij}$ connections need to be realized (i.e., a partially connected network).

Additionally, the cross connections $Xc_{ij}$ are indicated as "Rci Rco". This is an indication, that in the here proposed embodiment, RC coupling elements are used. However, also other types of coupling circuits or coupling elements (including active ones comprising semiconductor devices) can be used. Furthermore, a smaller or larger number of oscillators may be used. However, especially for convolutions in a neural network, it is useful to have as many oscillators as matrix elements of the convolutional matrix; i.e., for a 3×3 matrix with nine matrix elements it is useful to have nine oscillators, for a 4×4 matrix with 16 matrix elements is useful to have 16 oscillators, and so on.

In order to bring the ONN 200 in the context of FIG. 2, a connection will be discussed between the sliding 3×3 window (compare FIG. 2) and the nine oscillators X1 to X9. The "quasi-analog" input signal from a pixel of the sliding 3×3 window for one of the color channels is fed as a time-shifted edge signal to the input lines Vin of the nine oscillators X1, X2, . . . , X9. Hence, the image pixel values is encoded as time delays Δt of measured (grey scale) voltage value and passed to V1 to V9.

Thereby, Δt=0 ns for a white sub-square and, e.g., Δt=750 ns for a black sub-square. Thus, the bit edge input signals are phase-shifted by a fraction of a period length, a useful value may be half of the period of the frequency of the oscillator, e.g., 180° or π. Hence, the outputs V01, . . . , V09 of the oscillators X1 to X9 isolate with a phase φ relative to a reference, wherein φ=0 for white and φ=π for black. It is also worthwhile mentioning that the oscillators require a couple of cycles (e.g. 5) until the output values of the oscillators together with the (feedback) network build an energetic minimum at the output terminal V01, . . . V09 of the oscillators X1, . . . , X9 so that the phase of these signal is either 0 or 180°. This is a consequence of the training of the ONN 200 and the respective trained synaptic weight in the coupling components (i.e., the RC circuits).

For completeness reasons, it is also mentioned that the RC coupling elements are trained to represent the weights (i.e. synaptic weight) between the oscillators which represented the cores or nodes (or neurons) using, e.g., Hebbian learning.

As a next step, corresponding patterns to the input values to the oscillators need to be determined based on the output values and phases of the oscillators. For this, the active output circuit is instrumental and will be described using the next figure.

As shown in FIG. 5, the active output circuit 502 is shown comprising input terminals V01, V05, V09, the adder unit 504 and the nonlinear amplifier 506. Additionally, FIG. 5 shows copies of the active output circuit 502 indicated by reference numerals 508, 510 and 512, wherein the only difference is basically in the reference symbols of the input terminals and thus, in the received input signals: for the active output circuit 508 these are V03, V05, V06; for the active output circuit 510 these are V03, V05, V07; for the active output circuit 508 these are V02, V05, V08. The remaining components are functionally identical to the active output circuit 502.

The input terminals V01, V05, V09 of the active output circuit are connected to the output terminals V01, V05, V09 of the oscillators X1, X5, X9 of the oscillating neural network according to FIG. 4. Thus, the output values and phases of the oscillators can be used in order to determine one of the patterns "fall", "hor", "rise", and "vert" according to FIG. 2. Here, the translation from grey-scale to black and white has already happened.

For this, the input terminals V01, V05, V09 of the active output circuit 502 are connected via resistors R1, R2, R3 (all of equal resistance values, e.g. 100 kOhm) to an input line of a linear amplifier U1. For example, it may be equipped with a 1000 kOhm feedback resistor in a usual way. The built unit represents the adder unit 504. The output of the adder unit 504—denoted as test11—is fed to the input of the nonlinear amplifier 506. The nonlinear amplifier 506 is realized with the amplifier U2 and a diode D2 in the feedback line of the amplifier U2 which also has a connection to ground via R5. As amplifiers U1 and U2, industry standard differential amplifiers can be used.

Basically, the nonlinear amplifier 506 represents the sigmoid or ReLU function of traditional neural networks. The output test12 of the nonlinear amplifier 506 is the output of the proposed electronic circuit 100. It may be noted that the line test13, the oscillator X10, the resistor R12 and the line/connection test14 represent components of a next, subsequent layer of the neural network, i.e., the next filter.

Consequently, with a detection of synchronized outputs of the oscillators X1, X5 and X9 at the input terminals V01, V05, V09 of the active output circuit 502, a "fall" line in the corresponding 3×3 matrix can be determined.

A similar or comparable functioning applies to the active output circuits 508, 510 512 for the horizontal line "hor", the rising line "rise" and the vertical line "vert", respectively.

If more patterns—e.g., the ones of FIG. 4b—are detectable, the respective ones of the correlating oscillators need to be used as inputs for the respective active output unit.

FIG. 6 shows a signal timing diagram 600 at the output of an active output circuit (exemplary active output circuit 502 as shown in FIG. 5) together with a reference signal for one sample, here, a falling diagonal line. The dashed line represents a reference signal with corresponding peaks that would be expected for a falling diagonal line in a—e.g., sliding window 3×3 matrix input. The solid line represents the actual measurable output signal of the electronic circuit. As can be seen, the respective peaks have the same phase. Thus, a falling line has been determined.

Comparable correlations between the measurable and generated signals by the here proposed electronic circuit for other patterns can be observed.

As a proof of concept, FIG. 7 shows results of input images in greyscale on the left side 702 from the known MNIST (Modified National [US] Institute of Standards and Technology) database and resulting edge detections images 704 in black and white using the here proposed electronic circuit with the limited four simple patterns according to FIG. 3a. The results are surprisingly good and convincing.

FIG. 8 shows a computing system 800 using at least one of the here proposed electronic circuit according to FIG. 1 or a related device(s) for more than 1 color channels as co-processing unit for processing image data. However, embodiments of the invention may be implemented together with virtually any type of computer, regardless of the platform being suitable for storing and/or executing program code.

The computing system 800 is only one example of a suitable computer system, and is not intended to suggest any limitation as to the scope of use or functionality of the embodiments described herein, regardless, whether the computer system 800 is capable of being implemented and/or performing any of the functionality set forth hereinabove. In the computer system 800, there are components, which are operational with numerous other general purpose or special purpose computing system environments or configurations. Examples of well-known computing systems, environments, and/or configurations that may be suitable for use with computer system/server 800 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like. Computer system/server 800 may be described in the general context of computer system-executable instructions, such as program modules, being executed by a computer system 800. Generally, program modules may include routines, programs, objects, components, logic, data structures, and so on that perform particular tasks or implement particular abstract data types. Computer system/server 800 may be practiced in distributed cloud computing environments where tasks are performed by remote processing devices that are linked through a communications network. In a distributed cloud computing environment, program modules may be located in both, local and remote computer system storage media, including memory storage devices.

As shown in the figure, computer system/server 800 is shown in the form of a general-purpose computing device. The components of computer system/server 800 may include, but are not limited to, one or more processors or processing units 802, a system memory 804, and a bus 806 that couple various system components including system memory 804 to the processing units 802. Bus 806 represents one or more of any of several types of bus structures, including a memory bus or memory controller, a peripheral bus, an accelerated graphics port, and a processor or local bus using any of a variety of bus architectures. By way of example, and not limiting, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus. Computer system/server 800 typically includes a variety of computer system readable media. Such media may be any available media that is accessible by computer system/server 800, and it includes both, volatile and non-volatile media, removable and non-removable media.

The system memory 804 may include computer system readable media in the form of volatile memory, such as random access memory (RAM) 808 and/or cache memory 810. Computer system/server 800 may further include other removable/non-removable, volatile/non-volatile computer system storage media. By way of example only, a storage system 812 may be provided for reading from and writing to a non-removable, non-volatile magnetic media (not shown and typically called a 'hard drive'). Although not shown, a magnetic disk drive for reading from and writing to a removable, non-volatile magnetic disk (e.g., a 'floppy disk'), and an optical disk drive for reading from or writing to a removable, non-volatile optical disk such as a CD-ROM, DVD-ROM or other optical media may be provided. In such instances, each can be connected to bus 806 by one or more data media interfaces. As will be further depicted and described below, memory 804 may include at least one program product having a set (e.g., at least one) of program modules that are configured to carry out the functions of embodiments of the invention.

The program/utility, having a set (at least one) of program modules 816, may be stored in memory 804 by way of example, and not limiting, as well as an operating system, one or more application programs, other program modules, and program data. Each of the operating systems, one or more application programs, other program modules, and program data or some combination thereof, may include an implementation of a networking environment. Program modules 816 generally carry out the functions and/or methodologies of embodiments of the invention, as described herein.

The computer system/server 800 may also communicate with one or more external devices 818 such as a keyboard, a pointing device, a display 820, etc.; one or more devices that enable a user to interact with computer system/server 800; and/or any devices (e.g., network card, modem, etc.) that enable computer system/server 800 to communicate with one or more other computing devices. Such communication can occur via Input/Output (I/O) interfaces 814. Still yet, computer system/server 800 may communicate with one or more networks such as a local area network (LAN), a general wide area network (WAN), and/or a public network (e.g., the Internet) via network adapter 822. As depicted, network adapter 822 may communicate with the other components of the computer system/server 800 via bus 806. It should be understood that, although not shown, other hardware and/or software components could be used in conjunction with computer system/server 800. Examples, include, but are not limited to: microcode, device drivers, redundant processing units, external disk drive arrays, RAID systems, tape drives, and data archival storage systems, etc.

Additionally, the electronic circuit 100—e.g., with a respective bus interface—may be attached to the bus 806. A set of drivers and programming libraries can make it convenient to elegantly integrate the here proposed electronic circuit and/or the respective device into traditional computing system.

The descriptions of the various embodiments have been presented for purposes of illustration, but are not intended to be exhaustive or limited to the embodiments disclosed. Many modifications and variations will be apparent to those of ordinary skills in the art without departing from the scope and spirit of the described embodiments. The terminology used herein was chosen to best explain the principles of the embodiments, the practical application or technical improvement over technologies found in the marketplace, or to enable others of ordinary skills in the art to understand the embodiments disclosed herein.

The present embodiments may be embodied as a system, a method, and/or a computer program product. The computer program product may include a computer readable storage medium (or media) having computer readable program instructions thereon for causing a processor to carry out aspects of the present invention.

The medium may be an electronic, magnetic, optical, electromagnetic, infrared or a semi-conductor system for a propagation medium. Examples of a computer-readable medium may include a semi-conductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W), DVD and Blu-Ray-Disk.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disk read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object-oriented programming language such as Smalltalk, C++ or the like, and conventional procedural programming languages, such as the "C" programming language or similar programming languages. The computer readable program instructions may execute entirely on the user's computer, partly on the user's computer as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatuses, or another device to cause a series of operational steps to be performed on the computer, other programmable apparatus or other device to produce a computer implemented process, such that the instructions which execute on the computer, other programmable apparatuses, or another device implement the functions/acts specified in the flowchart and/or block diagram block or blocks.

The flowcharts and/or block diagrams in the figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or act or carry out combinations of special purpose hardware and computer instructions.

The terminology used herein is for the purpose of describing particular embodiments only and is not intended to limit the invention. As used herein, the singular forms "a", "an" and "the" are intended to include the plural forms as well, unless the context clearly indicates otherwise. It will further be understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or steps plus function elements in the claims below are intended to include any structure, material, or act for performing the function in combination with other claimed elements, as specifically claimed. The description of the present invention has been presented for purposes of illustration and description, but is not intended to be exhaustive or limited to the invention in the form disclosed. Many modifications and variations will be apparent to those of ordinary skills in the art without departing from the scope and spirit of the invention. The embodiments are chosen and described in order to best explain the principles of the invention and the practical application, and to enable others of ordinary skills in the art to understand the invention for various embodiments with various modifications, as are suited to the particular use contemplated.

The descriptions of the various embodiments have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An electronic circuit for utilizing an oscillating neural network for feature recognition, the electronic circuit comprising
    a network of coupled voltage-controlled oscillators, wherein each of the voltage-controlled oscillators is adapted for receiving an edge input signal which is phase-shifted by a fraction of a period length of the voltage-controlled oscillators according to a signal strength of an analog input signal allotted to a respective one of the voltage-controlled oscillators, and
    an active output circuit comprising
        input terminals connected to selected ones of the voltage-controlled oscillators,
        an adder portion for adding input signals present at the input terminals, and
        a non-linear amplifier, an input line of the non-linear amplifier being connected to an output line of the adder portion.

2. The electronic circuit according to claim 1, further comprising a plurality of active output circuits, wherein the input terminal of each of the plurality of active output circuits is connected to groups of the voltage-controlled oscillators, wherein each group represents a different predefined pattern of the received input signals.

3. The electronic circuit according to claim 2, wherein the selected voltage-controlled oscillators, when phase-shifted activated, represent a predefined pattern of the received input signals.

4. The electronic circuit according to claim 1, wherein the electronic circuit is adapted to process signals of one color channel.

5. The electronic circuit according to claim 1, wherein the electronic circuits represents a plurality of the electronic circuits connected in series, wherein each to the electronic circuits represents a predefined filter.

6. The electronic circuit according to claim 1, wherein each of the input terminals are connected to an input of a linear amplifier via a separate resistor respectively.

7. The electronic circuit according to claim 1, wherein the non-linear amplifier is a differential amplifier with a diode in a feedback loop thereof.

8. The electronic circuit according to claim 1, wherein each of the voltage-controlled oscillators in the network is connected to each other by a resistor/capacitor coupling circuit.

9. The electronic circuit according to claim 1, wherein the fraction of the period is half a period of an oscillating frequency of the voltage-controlled oscillators.

10. The electronic circuit according to claim 9, wherein the fraction of the period is larger than 120 degrees.

11. The electronic circuit according to claim 10, wherein the fraction of the period is 180 degrees.

12. The electronic circuit according to claim 1, wherein the active output circuit is integrated into a semiconductor unit.

13. The electronic circuit according to claim 1, wherein the electronic circuit is integrated into one semiconductor unit.

14. The electronic circuit according to claim 1, wherein a phase-shifting of an output of the non-linear amplifier of the active output circuit is aligned with a majority of received bit input signals to the active output circuit.

15. The electronic circuit according to claim 1, wherein the edge input signal changes from logical "0" to logical "1" depending on a shifting time derived from the signal strength of the analog input signal.

16. The electronic circuit according to claim 1, wherein each of the voltage-controlled oscillators oscillate with a same frequency.

17. A neural network device comprising:
    a plurality of electronic circuits, each of the electronic circuits including:
        a network of coupled voltage-controlled oscillators, wherein each of the voltage-controlled oscillators is adapted for receiving an edge input signal which is phase-shifted by a fraction of a period length of the voltage-controlled oscillators according to a signal strength of an analog input signal allotted to a respective one of voltage-controlled oscillators, and
        an active output circuit comprising
            input terminals connected to selected ones of the voltage-controlled oscillators,
            an adder portion for adding input signals present at the input terminals, and
            a non-linear amplifier, an input line of the non-linear amplifier being connected to an output line of the adder portion.

18. The neural network device according to claim 17, further comprising a plurality of active output circuits, wherein the input terminal of each of the plurality of active output circuits is connected to groups of voltage-controlled oscillators, wherein each group represents a different predefined pattern of the received input signals.

19. The neural network device according to claim 18, wherein the selected voltage-controlled oscillators, when phase-shifted activated, represent a predefined pattern of the received input signals.

20. The neural network device according to claim 18, wherein the electronic circuit is adapted to process signals of one color channel.

* * * * *